United States Patent
Adlerstein et al.

[19]

[11] Patent Number: 6,121,842
[45] Date of Patent: Sep. 19, 2000

[54] CASCODE AMPLIFIER

[75] Inventors: Michael G. Adlerstein, Wellesley; Mark P. Zaitlin, Harvard, both of Mass.

[73] Assignee: Raytheon Company, Lexington, Mass.

[21] Appl. No.: 08/861,410

[22] Filed: May 21, 1997

[51] Int. Cl.$^7$ ...................................................... H03F 3/14
[52] U.S. Cl. ......................... 330/307; 330/295; 257/565
[58] Field of Search ................................... 330/307, 295, 330/311; 257/205, 565, 566, 577, 572, 529

[56] References Cited

U.S. PATENT DOCUMENTS

| | | | |
|---|---|---|---|
| 3,586,887 | 6/1971 | Ziel et al. | 307/295 |
| 3,723,894 | 3/1973 | Benenati | 330/282 |
| 4,097,814 | 6/1978 | Cohn | 330/286 |
| 4,112,386 | 9/1978 | Everhart et al. | 330/307 |
| 4,342,967 | 8/1982 | Regan et al. | 330/277 |
| 4,394,625 | 7/1983 | Sakai | 330/307 |
| 4,658,220 | 4/1987 | Heston et al. | 330/277 |
| 4,760,350 | 7/1988 | Ayasli | 330/277 |
| 4,820,999 | 4/1989 | Csanky | 330/277 |
| 5,015,968 | 5/1991 | Podell et al. | 330/277 |
| 5,061,903 | 10/1991 | Vasile | 330/311 |
| 5,066,926 | 11/1991 | Ramachandran et al. | 330/311 |
| 5,175,513 | 12/1992 | Hara | 331/115 |
| 5,227,734 | 7/1993 | Schindler et al. | 330/277 |
| 5,229,665 | 7/1993 | Jemison et al. | 307/521 |
| 5,488,382 | 1/1996 | Fenzi et al. | 343/700 R |
| 5,742,205 | 4/1998 | Cowen et al. | 330/311 |
| 5,926,069 | 7/1999 | Ko et al. | 330/302 |

*Primary Examiner*—Robert Pascal
*Assistant Examiner*—Khanh Van Nguyen
*Attorney, Agent, or Firm*—Fish & Richardson P.C.

[57] ABSTRACT

A cascode amplifier formed as an integrated circuit on a III–V substrate. The substrate has a pair of elongated active regions formed along a pair of laterally spaced active regions of a surface of the substrate. Each one of the active regions has formed therein a plurality of electrically interconnected transistor cells. The transistor cells in a first one of the active regions are interconnected in a common emitter configuration and the plurality of transistor cells in a second one of the active regions are interconnected in a common base configuration. A plurality of first resistors is disposed over the surface of the substrate, each one of the resistors having a first electrode adapted for coupling to ground potential and a second electrode connected to emitter regions of a corresponding pair of adjacent transistor cells formed in the first one of the regions.

37 Claims, 6 Drawing Sheets

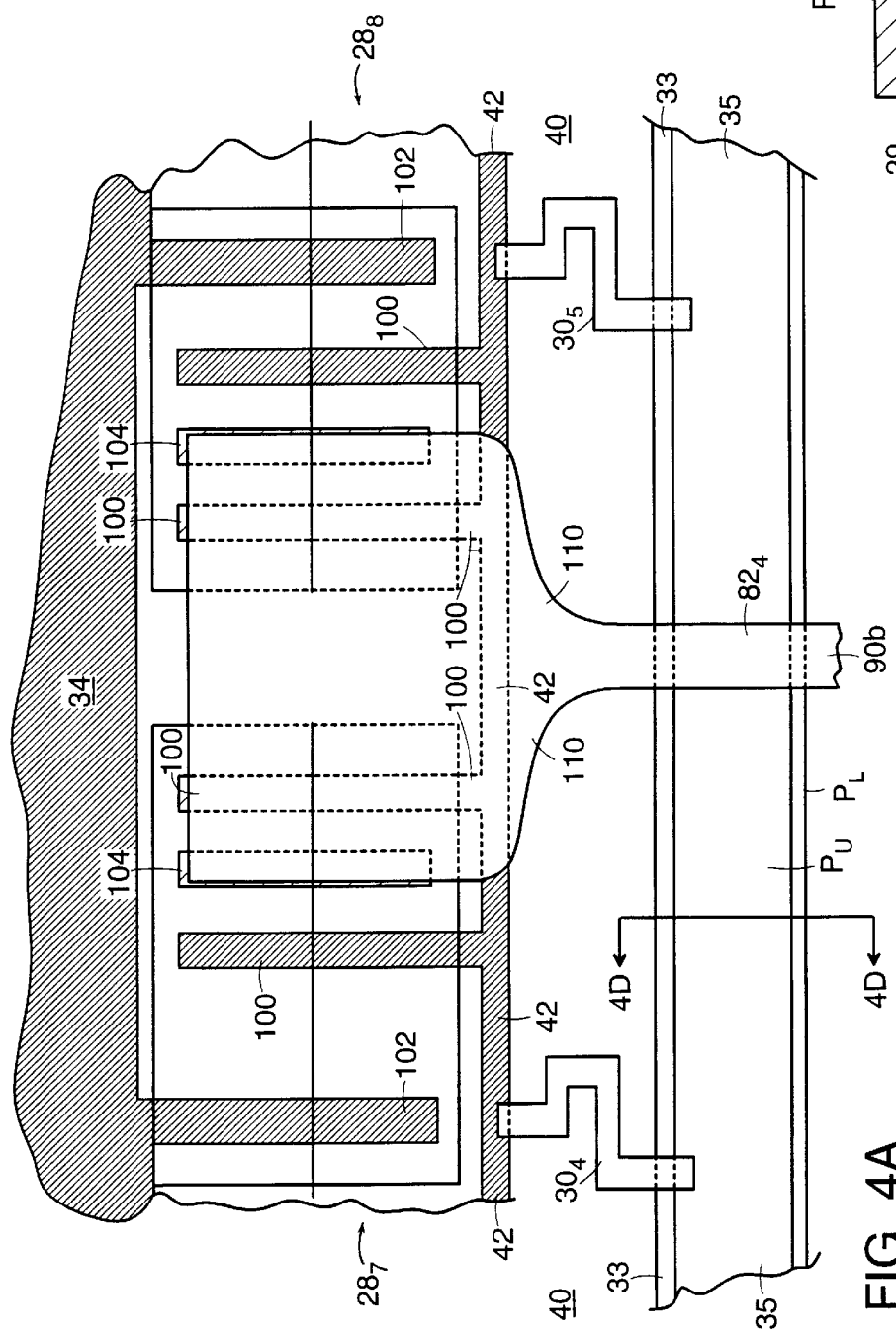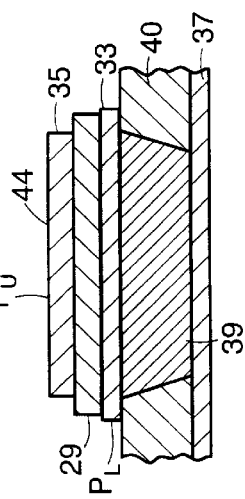
FIG. 4A
FIG. 4D

CASCODE AMPLIFIER

BACKGROUND OF THE INVENTION

This invention relates generally to cascode amplifiers and more particularly to amplifiers of such type which are adapted to amplify cable television signals.

As is known in the art, in transmitting television signals through cables, amplifiers are needed at various points along the transmission path. One type of amplifier used for this purpose is shown in FIG. 1. Such amplifier includes two pairs 12, 14 of silicon transistors. Each pair of transistors is connected in a cascode configuration. The two pairs of transistors are driven by an input transformer 16 and the outputs of the pairs are connected to an output transformer 19. The two pairs of transistors 12, 14 are biased to operate in a linear, class A push-pull configuration. Amplifiers of this type are available and operate from 50 MHz to 550 MHZ.

In the future it is expected that the upper limit of the band will increase to 1000 MHz in systems which would carry at least 110 asynchronous analog signals. Intermodulation distortion must be minimized in such a system. It is expected that the peak power required per output transistor will 1.9 watts at 1 db compression point and that the gain required will be 18–20 db. Further, the amplifier must be economically practical.

SUMMARY OF THE INVENTION

In accordance with one feature of the invention, a cascode amplifier is provided. The amplifier is formed as an integrated circuit on a substrate. The substrate has a pair of elongated active regions formed along a pair of laterally spaced regions of a surface of the substrate. Each one of the active regions has formed therein a plurality of electrically interconnected transistor cells. The transistor cells in a first one of the active regions are interconnected in a common emitter configuration and the plurality of transistor cells in a second one of the active regions are interconnected in a common base configuration. A plurality of first resistors is disposed over the surface of the substrate. Each one of the resistors has a first electrode adapted for coupling to ground potential and a second electrode connected to emitter regions of a corresponding pair of adjacent transistor cells formed in the first one of the active regions.

In accordance with another feature of the invention, each one of the transistor cells in the first one of the active regions has a collector region connected to an emitter region of a corresponding one of the transistor cells in the second one of the active regions. The collector regions of the transistor cells in the second one of the active regions are connected to a common output bus disposed over the surface of the substrate to provide an output for the amplifier.

In accordance with still another feature of the invention, a capacitor is provided on the substrate. The capacitor has a first, lower plate adapted for coupling to ground and a second, upper plate coupled to the base regions of the transistor cells in the second region.

In accordance with another feature of the invention, a plurality of second resistors is formed over the surface of the substrate. The second resistors are electrically connected between base regions of the transistor cells in the second active region and the upper plate of the capacitor.

In accordance with still another feature of the invention, the upper plate of the capacitor comprises an elongated conductive layer disposed over the a surface portion of the substrate between the first and second active regions. The conductive layer provides a bus. First electrodes of the second resistors are connected successively along the bus. The bus terminates in contact pads adapted for coupling a dc power supply to the base regions of the transistor cells in the second active region.

In accordance with still another feature of the invention, a second conductive layer is disposed under, and dielectrically separated from, the first-mentioned conductive layer to provide a second plate for the capacitor. In a preferred embodiment, the second conductive layer is connected to a ground plane conductor disposed on a bottom surface of the substrate by a conductive via passing from the second conductive layer to the ground plane conductor through the substrate.

In accordance with another feature of the invention, a second bus is disposed parallel to the conductive layers with first electrodes of the second resistor connected successively along the second bus. The base electrodes of the transistor cells in the second active region are also successively connected along the second bus thereby electrically interconnecting such base electrodes to the first electrodes of the second transistors. Second electrodes of the second resistors are connected successively along the first-mentioned conductive layer; i.e, the first-mentioned bus-the upper plate of the capacitor. Thus, the base electrodes of the transistor cells in the second active region are connected to the upper plate of the capacitor through the plurality of second resistors.

In accordance with another feature of the invention, the second plurality of resistors is disposed over a region of the surface of the substrate between the elongated conductive layers and the second active region.

In accordance with still another feature of the invention, a plurality of conductive via contacts is formed in an elongated region of the substrate. The first active region is disposed between the elongated conductive via contact region and the conductive layers. The conductive via contacts are electrically connected to the first electrodes of the first resistors.

In accordance with still another feature of the invention, a third elongated bus is disposed between the first active region and the elongated conductive via contact region to electrically connect base regions of the plurality of transistor cells in the first active region. In a preferred embodiment, the base regions of the transistor cells in the first active region are electrically connected successively along the third elongated bus.

A third plurality of resistors is disposed over the surface of the substrate. The third plurality of resistors are disposed perpendicular to the buses, the first and second active regions and between adjacent pairs of the conductive via contacts. The third resistors have first electrodes adapted for coupling to an input of the amplifier and second electrodes electrically connected successively along the third elongated bus.

In accordance with still another feature of the invention, a plurality of bridges is disposed over the surface of the substrate. The bridges pass over the third elongated bus and electrically connects the first plurality of resistors to the emitter regions of the transistor cells in the first active region.

In accordance with another feature of the invention, a second plurality of bridges is disposed over the surface of the substrate. The second plurality of bridges pass over the conductive layers, the first-mentioned bus and the second conductive bus and interconnects emitter regions of the transistor cells in the second active region to the collector regions of the transistor cells in the first active region.

In accordance with still another feature of the invention, each one of the second bridges electrically connects a collector region of one of the transistor cells in the first active region to emitter regions of an adjacent pair of transistor cells in the second active region.

BRIEF DESCRIPTION OF THE DRAWING

These and other objects of the invention as well as the invention itself will become more readily apparent from the following detailed description when taken together with the accompanying drawings, in which:

FIG. 4A is diagrammatical plan view of a portion of the amplifier of FIG. 3A, such portion showing a pair of adjacent transistor cells used in such amplifier and configured to provide a common base transistor for the amplifier in FIGS. 2A and 2B;

FIG. 4D is a diagrammatical cross-sectional view of a portion of a capacitor used in the amplifier of the FIG. 3A, such cross section being taken along line 4D–4D of FIG. 4A.

DESCRIPTION OF THE PREFERRED EMBODIMENTS

Figure 1:
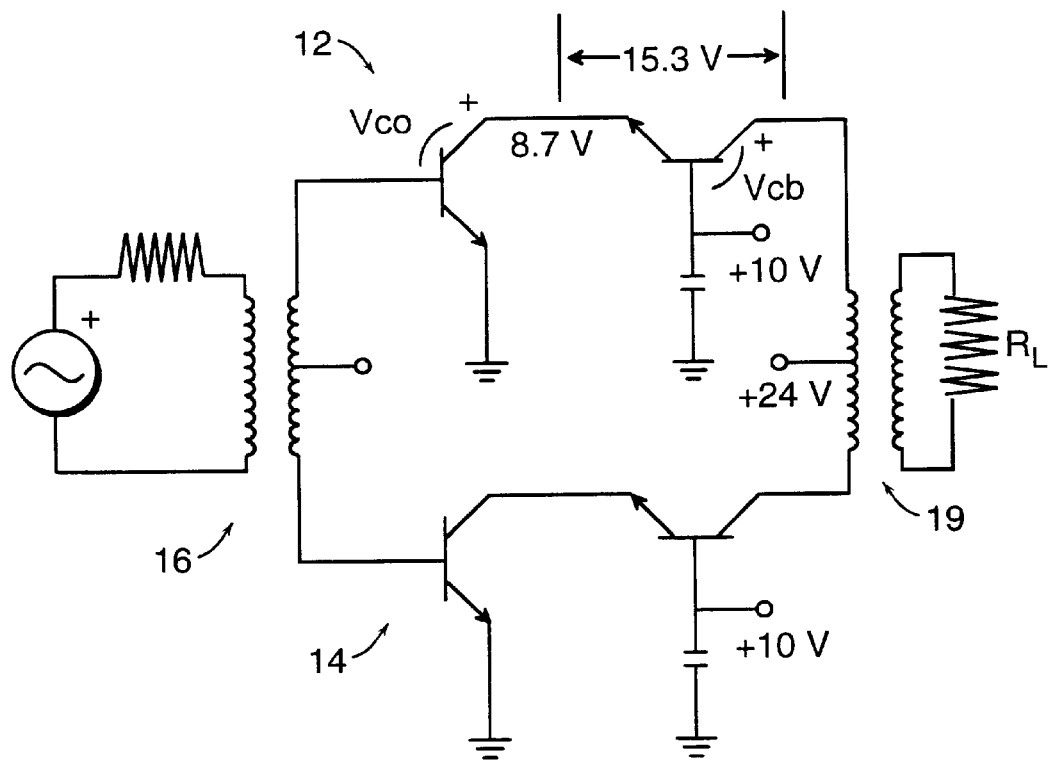
FIG. 1 is a schematic diagram of an amplifier according to the prior art.
Figure 2A:
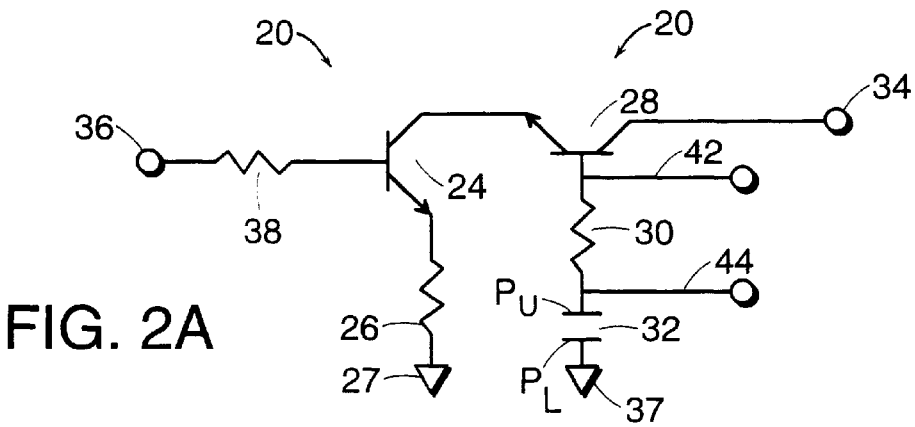
FIGS. 2A and 2B are a schematic diagram and a diagrammatical sketch, respectively, of an amplifier according to the invention.
Figure 2B:
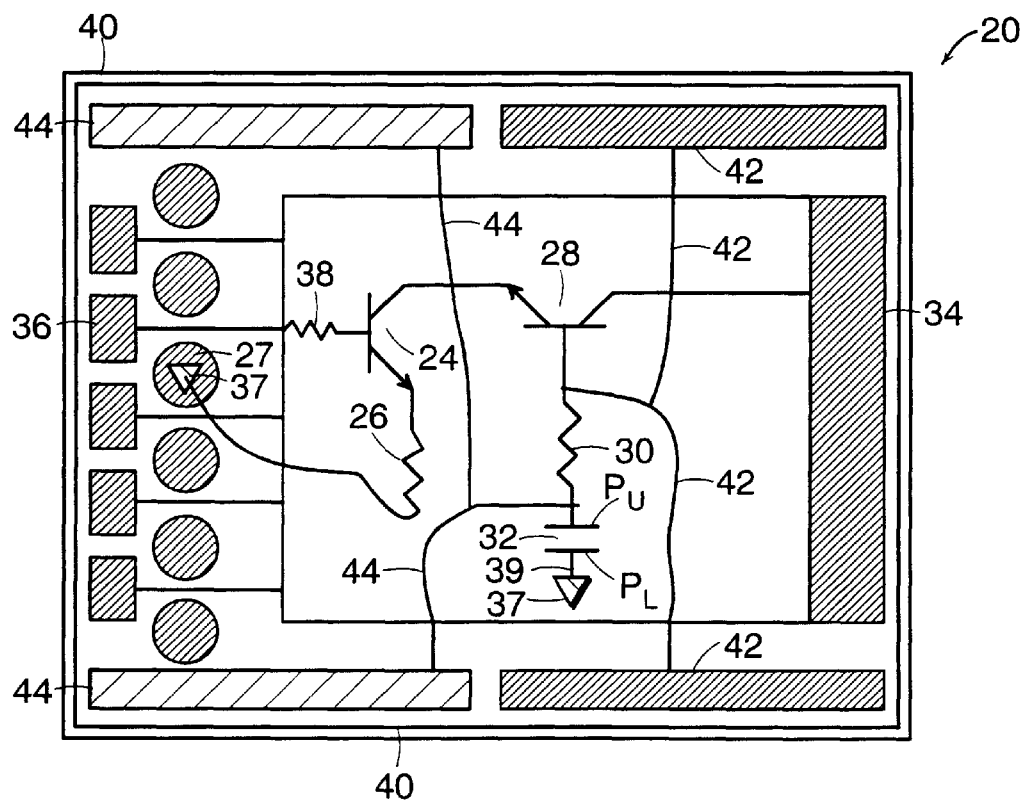

Referring now to FIGS. 2A and 2B, an amplifier 20 is shown having a pair of transistors 24, 28 connected in a cascode configuration. As shown schematically in FIG. 2B, the amplifier 20 is formed as a monolithic integrated circuit, here on a III-V single crystal substrate 40. Here, the substrate 40 is gallium arsenide. The transistors 24, 26 are heterojunction bipolar transistors, shown more clearly in FIG. 4C, here have a thin AlGaAs or thin InGaP heterojunction emitter layer region typically 300 to 500 angstroms to allow for selective etching to an emitter-base junction passivation layer. Preferably, an InGaP emitter region is used. The collector region is here one micrometer thick.

A first transistor 24 has the emitter region connected to a ground plane conductor 37 (formed on the bottom surface of the substrate 40 by a conductive via contact 27) through a first resistor 26, as shown. The collector region of the first transistor 24 is connected to the emitter region of a second transistor 28, as shown. The base region of the second transistor 28 is connected to the ground plane conductor 37 through a second resistor 30 and serially connected capacitor 32, as shown. The collector region of the second transistor 28 provides the output 34 for the amplifier 20. The base region of the first transistor 24 is connected to the input 36 of the amplifier 20 through a third resistor 38, as shown.

Referring again to FIGS. 2A and 2B, it is noted that bus 42 is connected to the base region of transistor 28 for coupling to an external dc voltage supply, not shown, for biasing the amplifier 20 to class A operation. Another bus 44 is connected to an upper plate, $P_u$, of capacitor 32; the lower plate $P_L$ of the capacitor being connected to the ground plane conductor 37 by via conductor 39 which passes through the substrate 40. The bus 44 enables an additional, larger capacitor, not shown, external to the integrated circuit substrate 40, to be connected to the capacitor 32. The capacitor 32 formed on the substrate 40 may be relatively small and is used to provide a high frequency path to ground. As noted, a larger capacitor may be coupled by the bus 44, which has an inductive reactance, to allow for bypassing of the lower frequency portion of the band.

Figure 3A:
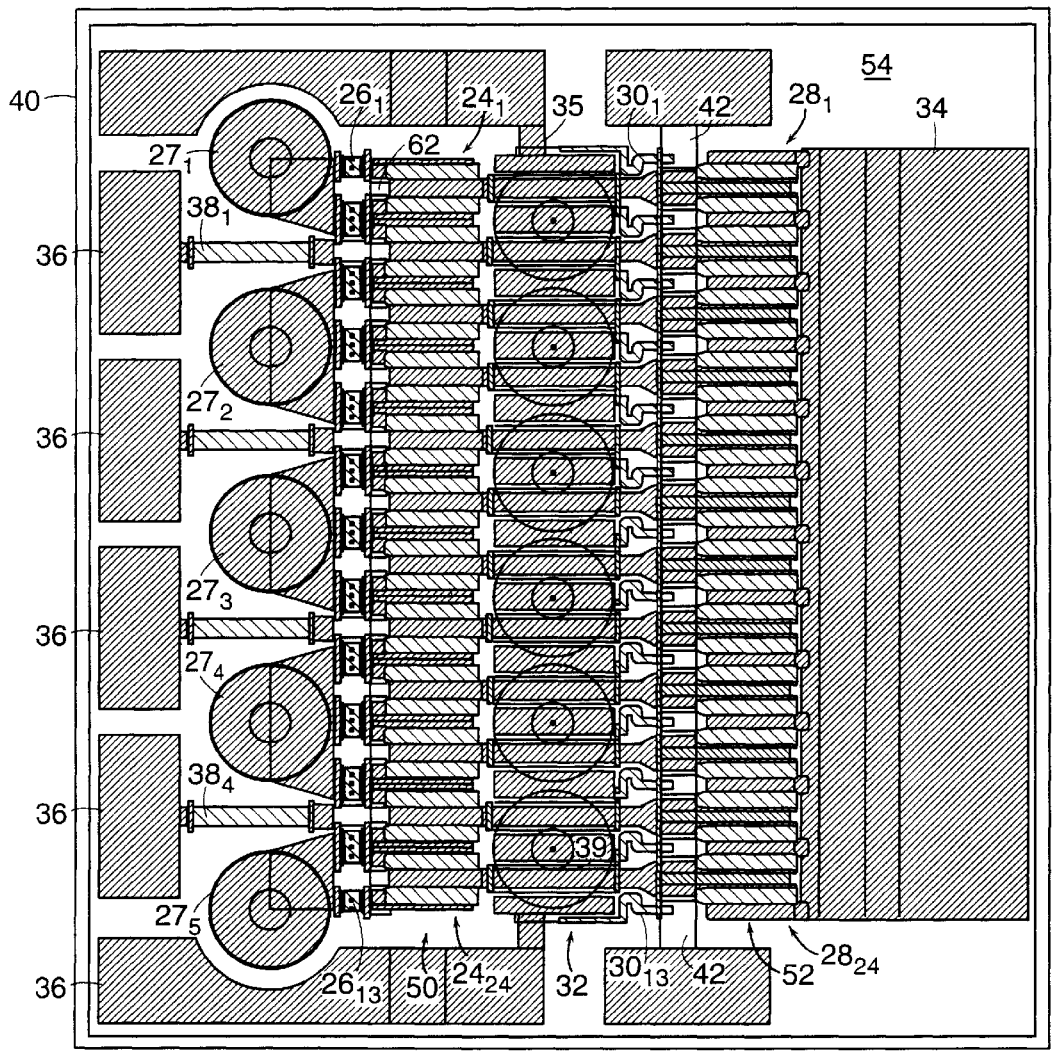
FIG. 3A is a plan view of the amplifier of FIGS. 2A and 2B.
Figure 3B:
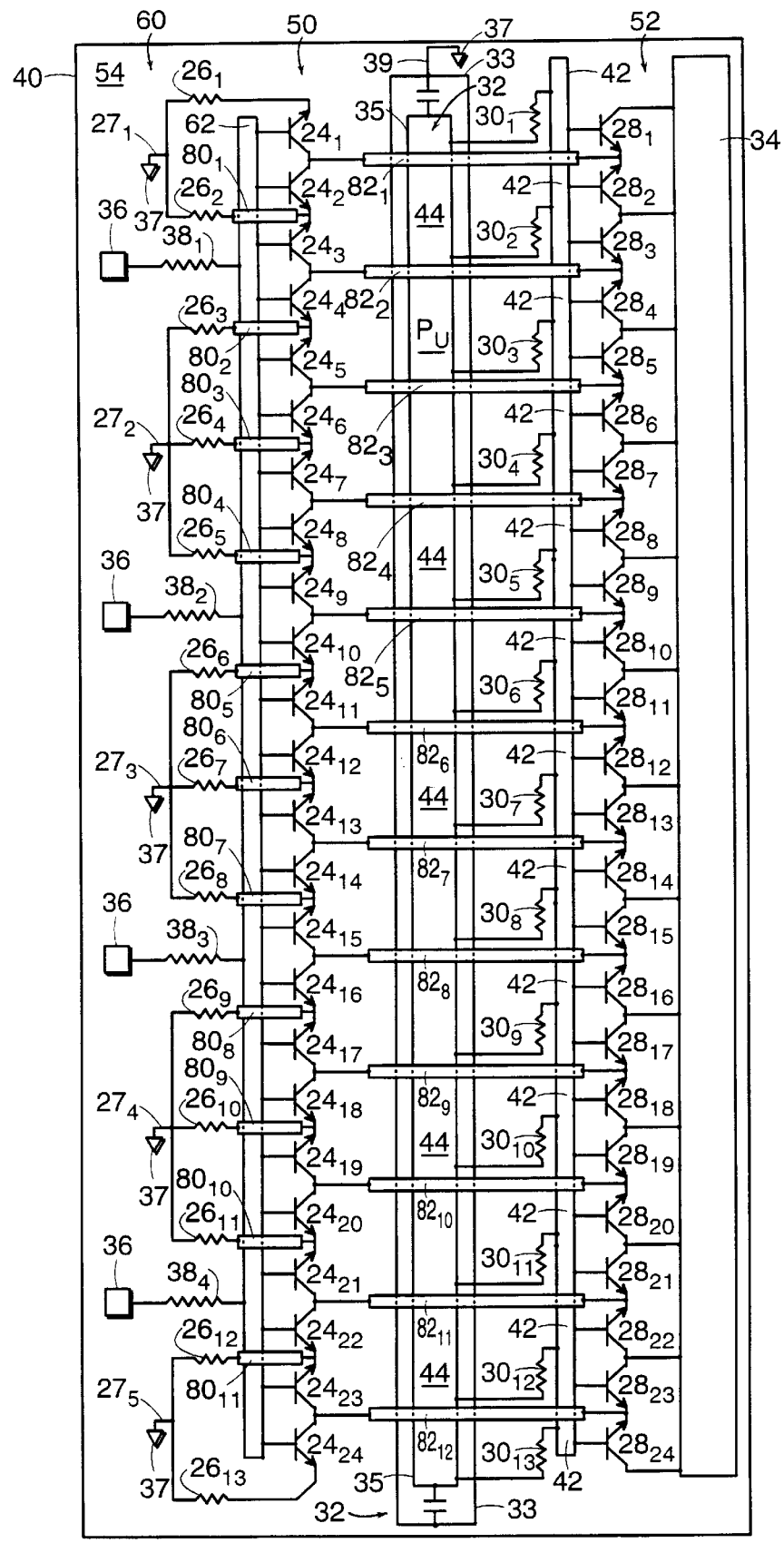
FIG. 3B is a schematic diagram of the amplifier of FIG. 3A.

Referring now to FIGS. 3A and 3B, the substrate 40 is shown with a pair of elongated active regions 50, 52 (FIG. 3B) formed along a pair of laterally spaced regions of the upper surface 54 of the substrate 40. Each one of the active regions 52, 54 has formed therein a plurality of, here for example 24, electrically interconnected transistor cells $24_1$–$24_{24}$, $28_1$–$28_{24}$, respectively. The transistor cells $24_1$–$24_{24}$ in a first one of the active regions 52 provide the first transistor 24 in FIGS. 2A and 2B and therefore the transistor cells $24_1$–$24_{24}$ are interconnected in a common emitter configuration. The plurality of, here for example 24, transistor cells $28_1$–$28_{24}$ in a second one of the active regions 52 provide the second transistor 28 (FIGS. 2A and 2B) and are therefore interconnected in a common base configuration. The cells $24_1$–$24_{24}$ and $28_1$–$28_{24}$ are described in co-pending patent application entitled "Heterojunction Bipolar Transistor", Ser. No. 08/827,851 Apr. 11, 1997, U.S. Pat. No. 5,986,324 issued Nov. 16, 1999 inventors Adlerstein et al., and assigned to the same assignee as the present invention, the entire subject matter thereof being incorporated herein by reference.

A plurality of, here for example 13, first resistors $26_1$–$26_{13}$ provide the first resistor 26 (FIGS. 2A and 2B) and are disposed over the upper surface 54 of the substrate 40. The first resistors $26_1$–$26_{13}$ have first electrodes adapted for coupling to the ground plane conductor 37 through conductive vias $27_1$–$27_5$ which pass through the substrate 40 and second electrodes connected to emitter regions of the transistor cells $24_1$–$24_{24}$ in the first active region 50. (The ground plane conductor 37 is adapted for coupling to ground potential.) More particularly, the second electrodes of resistors $26_1$, and $26_{13}$ are connected to the emitter regions of transistor cells $24_1$, and $24_{24}$, respectively, as shown schematically for transistor cell $24_1$ and resistor $26_1$ in FIG. 3B. Each one of the first resistors $26_2$–$26_{12}$ has a first electrode adapted for coupling to ground potential, as described above. A second electrode of each one of the resistors $26_2$–$26_{12}$ is connected to emitter regions of a corresponding pair of adjacent transistor cells $24_1$–$24_{23}$. Thus, the emitter regions of the pair of adjacent transistor cells $24_2$, $24_3$ are connected to a common resistor $26_2$; the emitter regions of the pair of adjacent transistor cells $24_4$, $24_5$ are connected to a common resistor $26_3$; the emitter regions of the pair of adjacent transistor cells $24_4$, $24_5$ are connected to a common resistor $26_3$; the emitter regions of the pair of adjacent transistor cells $24_6$, $24_7$ are connected to a common resistor $26_4$; . . . and, the emitter regions of the pair of adjacent transistor cells $24_{22}$, $24_{23}$ are connected to a common resistor $26_{12}$. Thus, the size (i.e., surface area) of resistor $26_1$ and resistor $26_{13}$ is half the size (i.e., surface area) of each of the resistors $26_2$–$26_{12}$, as shown in FIG. 3A.

Each one of the transistor cells $24_1$–$24_{24}$ in the first one of the active regions 50 has a collector region connected to an emitter region of a corresponding one of the transistor cells $28_1$–$28_{24}$ in the second one of the active regions 52. The collector regions of the transistor cells $28_1$–$28_{24}$ in the second one of the active regions 52 are connected to a common output bus 34 disposed over the upper surface 54 of the substrate 40 to provide an output 34 for the amplifier 20.

A capacitor 32 is provided on the substrate 40. The capacitor 32 has a first, lower or bottom, plate $P_L$ adapted for coupling to ground plane conductor 37 through conductive vias 39 which pass through the substrate 40 in a manner similar to conductive vias $27_1$–$27_5$ as shown in FIG. 4D and a second, upper, plate $P_U$ electrically connected to base regions of the transistor cells $28_1$–$28_{24}$ in the second active region 52. More particularly, the plates $P_L$, $P_U$ of the capacitor 32 are dielectrically separated elongated conductive layers 33, 35, the lower conductive layer 33 being somewhat larger than the upper conductive layer 35, as shown more clearly in FIG. 4D. It is noted in FIG. 4D that the upper plate $P_U$ (i.e., conductive layer 35) and lower plate $P_L$ (i.e., conductive layer 33) are separated by a dielectric layer 29, here silicon nitride. It is also noted that the lower plate $P_L$ (i.e., layer 33) is connected to the ground plane conductor 37 formed on the bottom surface of the substrate 40 by a plurality of, here six circular tapered via conductors 39 which pass from the bottom of the bottom plate $P_L$ of capacitor 32 through the substrate 40 to the ground plane conductor 37 formed on the bottom surface of the substrate 40, only exemplary one of the conductive vias 39 being shown in FIG. 4D. The upper conductive layer 35 provides the bus 44. It is noted that bus 44 is an elongated bus.

Figure 4B:
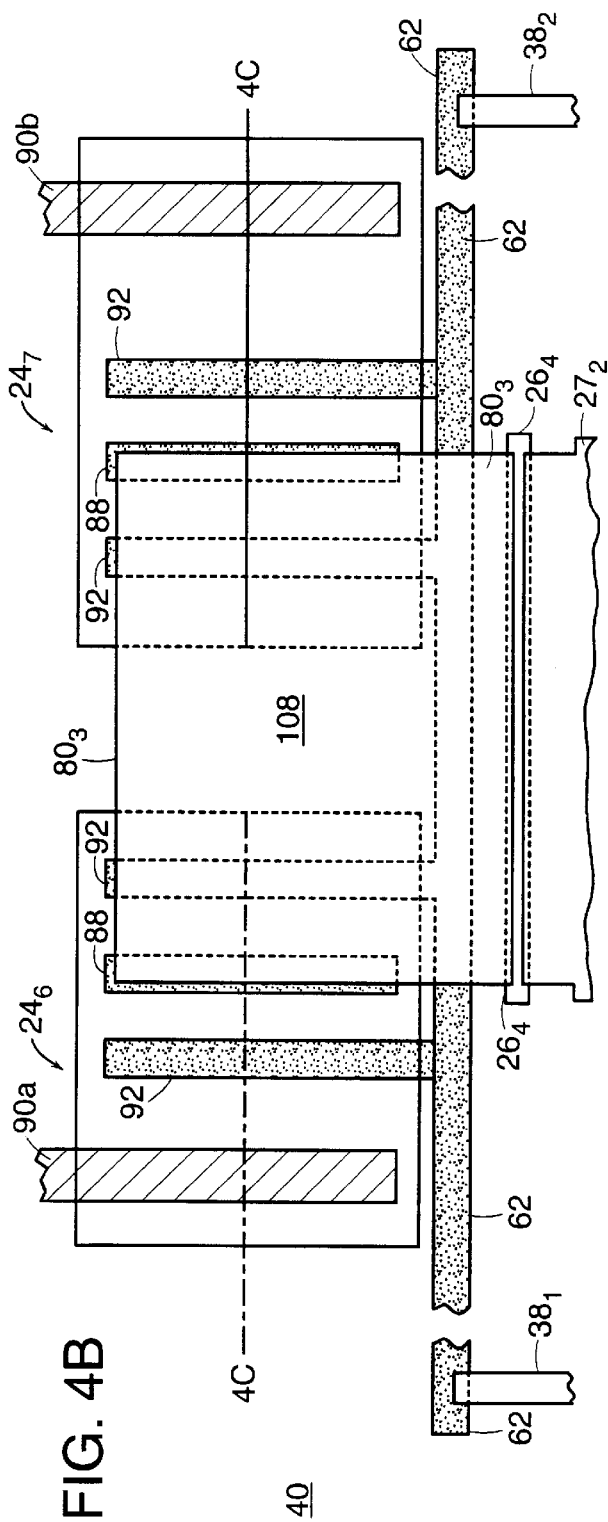
FIG. 4B is diagrammatical plan view of a portion of the amplifier of FIG. 3A, such portion showing a pair of adjacent transistor cells used in such amplifier and configured to provide a common emitter transistor.

Referring to FIGS. 4a, 4B, a plurality of, here for example 13, second resistors $30_1$–$30_{13}$ provide the second resistor 30 (FIGS. 2A and 2B) and are disposed over the upper surface 54 of the substrate 40. The second resistors $30_1$–$30_{13}$ have first electrodes electrically connected to the upper plate, $P_U$ of the capacitor 32 (i.e., successively connected along elongated bus 44) and second electrodes electrically connected successively along bus 42. It is noted that the bus 42 is an elongated bus disposed parallel to bus 44 and to elongated active regions 50, 52. Also connected successively along the bus 42 are the base regions of the transistor cells $28_1$–$28_{24}$ in the second active region 52. Thus, the base regions of the transistor cells $28_1$–$28_{24}$ are electrically interconnected by bus 42. Thus, bus 42 provided the electrical connection between the base regions of the transistor cells $28_1$–$28_{24}$ and the upper plate, $P_u$, of capacitor 32 through the second plurality of resistors $30_1$–$30_{12}$.

Referring also to FIG. 3A, a plurality of, here for example 5, conductive via contacts $27_1$–$27_5$ is formed through the substrate 40 to ground plane conductor 37 in an elongated region 60 of the substrate 40 to provide the ground contact 27 shown in FIGS. 2A and 2B. Thus, as noted above, the vias $27_1$–$27_5$ are similar to vias 39 as shown in FIG. 4D. The first active region 50 is disposed between the elongated region 60 and the conductive layers 33, 35 as shown in FIG. 3A. The conductive via contacts $27_1$–$27_5$ are electrically connected to the first electrodes of the first resistors $26_1$–$26_{13}$. The first resistors $26_1$–$26_{13}$ are ballast resistors as described in the above referenced co-pending patent application.

More particularly, conductive via contact $27_1$ is connected to first electrodes of resistors $26_1$ and $26_2$, as shown in FIG. 3A. Conductive via contact $27_2$ is connected to first electrodes of resistors $26_3$ through $26_5$. Conductive via contact $27_3$ is connected to first electrodes of resistors $26_6$ through $26_8$. Conductive via contact $27_3$ is connected to first electrodes of resistors $26_9$ through $26_{11}$. Conductive via contact $27_5$ is connected to first electrodes of resistors $26_{12}$ and $26_{13}$.

Thus, each one of the plurality of conductive via contacts $27_1$ is connected to first electrodes of the first electrodes of the first resistors $26_1$–$26_{13}$.

Referring to FIG. 3B, an elongated bus 62 is disposed between the first active region 50 and the elongated conductive via contact region 60. A third plurality of, here 4, resistors $38_1$–$38_4$ is disposed over the upper surface 54 of the substrate 40 to provide the third resistor 38 shown in FIGS. 2A and 2B. The third plurality of resistors $38_1$–$38_4$ is disposed perpendicular to the elongated first and second active regions 50, 52 and between adjacent pairs of the conductive via contacts $27_1$–$27_5$, as shown in FIG. 3A. Each one of the third resistors $38_1$–$38_4$ has a first electrode adapted for coupling to an input pad 36 of the amplifier 20 and a second electrode connected to the bus 62. (While the input pads 36 are shown as separate pads which are fed by individual wires, not shown, to a signal pad external to the substrate 40, the pads 36 may be formed on the substrate 40 as a single pad). The base regions of the transistor cells $24_1$–$24_{24}$ in the first active region 50 are also electrically connected to the bus 62. Therefore, the third resistors $38_1$–$38_4$ are electrically connected to the base regions of the transistors cells $24_1$–$24_{24}$.

Referring to FIG. 3B, a plurality of, here 11, bridges $80_1$–$80_{11}$ is disposed over the upper surface 54 of the substrate 40. Each one of the bridges $80_1$–$80_{11}$ is an airbridge which passes over the bus 62 and electrically connects a second electrode of one of the third resistors $26_1$–$26_{13}$ to the emitter regions of the transistor cells $24_1$–$24_{24}$ in the first active region 50, as shown in FIG. 3B. The elongated bus 42 is disposed parallel to the first-mentioned bus 62 and electrically connects base regions of the transistor cells $28_1$–$28_{24}$ in the second active region. A second plurality of, here 12 bridges $82_1$–$82_{12}$ is disposed over the upper surface 54 of the substrate 40. Each one of the second plurality of bridges $82_1$–$82_{12}$ is an air-bridge which passes over the overlaying conductive layers 33, 35 forming the capacitor 32 and over the bus 42 to electrically interconnect an emitter region of one of the transistor cells $28_1$–$28_{24}$ in the second active region 52 to the collector region of a corresponding one of the transistor cells $24_1$–$24_{24}$ (FIG. 3A) in the first active region 50.

Figure 4C:
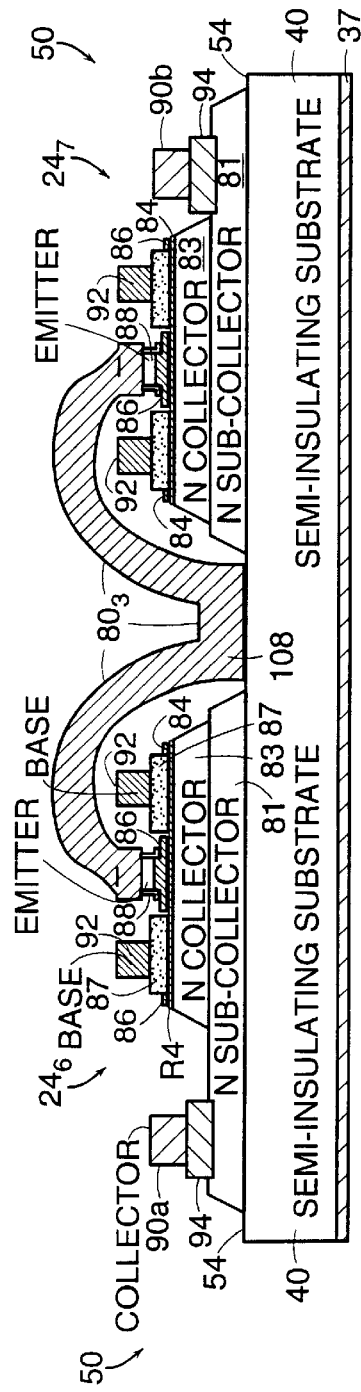
FIG. 4C is a cross-sectional view of the portion of the amplifier shown in FIG. 4B, such cross section being taken along line 4C–4C in FIG. 4B.

Referring now to FIGS. 4A, 4B and 4C, an exemplary adjacent pair of the heterojunction bipolar transistor cells $24_1$–$24_{24}$, here adjacent pair of transistor cells $24_6$, $24_7$ is shown. Thus, as noted above the transistor cells $24_6$, $24_7$ are formed on a single crystal, semi-insulating substrate 40 of III-IV material, here semi-insulating gallium arsenide. Each one of the transistor cells $24_6$, $24_7$ respectively, includes a III-V sub-collector layer 81 having a relatively high first conductivity type dopant, here $N^+$type conductivity gallium arsenide disposed over the upper surface, of the substrate gallium arsenide layer 40. A III–V collector layer 83 having the first type conductivity dopant, here N type conductivity gallium arsenide, is disposed over laterally spaced portions of the upper surface of the substrate 40, as shown. The N type conductivity gallium arsenide collector layer 83 is disposed on a portion of the sub-collector layer 81, as shown. A III-V, here gallium arsenide, base layer 84 having a relatively high second conductivity dopant (i.e., here $P^+$type conductivity) opposite to the type conductivity of the first type conductivity dopant is epitaxially grown over a surface of the collector layer 83. A III-V, here aluminum gallium arsenide or indium gallium phosphide, for example, emitter region 86 is epitaxially formed over the base region layer 84 providing a heterojunction between the III-V emitter region 86 and the base region layer 84. The emitter region 86 has N type conductivity. An emitter electrode 88 is disposed on the emitter region 86. Silicon nitride dielectric material, not numbered, is disposed about the outer sidewalls of the emitter electrode 88 and emitter region 86, as shown.

Collector electrodes 90a, 90b (FIGS. 4B, 4C) are electrically connected to the sub-collector layer 81 through ohmic contact metal 94, as shown, for transistor cells $24_6$, $24_7$, respectively, as shown. Base electrodes 92 are electrically connected to the base layer 84) through ohmic contact metal 86, as shown. The base electrodes 92 are adapted to control the flow of carriers between the collector electrodes 90 and the emitter electrodes 88. It is noted that the collector electrode 90b is connected to air-bridge $82_4$, as shown more clearly in FIG. 4A. It is also noted that the emitter electrodes 88 are connected to air-bridge $80_3$, as shown more clearly in FIG. 4C. Further, it is noted that the air-bridge $80_3$ is connected to one electrode of resistor $26_4$ and the other electrode of resistor $26_4$ is connected to via contact $27_2$, as shown. Further, the air-bridge $80_3$ passers over bus 62 and over one of a pair of base electrodes 92 used for each one of the transistor cells $24_6$, $24_7$. It is also noted that bus 62 is connected to one electrode of resistors $38_1$ and $38_2$, as shown in FIG. 4B.

Referring to FIG. 4A, it is noted that the upper plate $P_U$ (i.e., conductive layer 35) is electrically connected to one electrode of the resistors $30_4$, $30_5$. The other electrode of resistors $30_4$, $30_5$ are shown connected to bus 42. Also connected to bus 42 are the base electrodes 100 of transistor cells $28_7$, $28_8$. It is also noted that the transistor cells $28_1$–$28_{24}$ are substantially the same as the transistor cells $24_6$, $24_7$ shown in FIG. 4C. The collector electrodes 102 of the exemplary pair of adjacent cells $28_7$, $28_8$ are connected to output bus 24.

It is noted that each one of the cells $24_6$, $24_7$, $28_7$, $28_6$ (FIG. 4A) has a pair of base electrodes 92, 100, respectively, (FIG. 4B) one on each side of the emitter electrode 88, 104, respectively, as shown. Also, the transistor cells $24_1$–$24_{24}$, $28_1$–$28_{24}$ are mesa structures, as shown in FIG. 4C for exemplary cells $24_6$, $24_7$. The base and collector electrodes 90, 92, 100, 102 are disposed on the substrate 40 and are connected to the finger-like, i.e., elongated, base and collector electrodes by the forming portions which pass from the substrate 40 over edges of the mesas as short air-bridges.

The emitter electrodes 88, 100 are also finger-like, (i.e., elongated) and are electrically connected to an emitter pad 108 disposed between the pair of transistor cells $24_6$, $24_7$ by air-bridges $80_3$ and air-bridges 110 for cells $28_7$, $28_8$ as shown.

Other embodiments are within the spirit and scope of the appended claims.

What is claimed is:

1. An amplifier having a pair of transistors arranged in a cascode configuration, such amplifier, comprising:
   a substrate;
   a pair of elongated active regions formed along a pair of laterally spaced regions of a surface of the substrate, each one of the active regions having formed therein a plurality of electrically interconnected transistor cells, and
      wherein the transistor cells in a first one of the active regions are interconnected in a common emitter configuration to provide one of the pair of transistors and the plurality of transistor cells in a second one of the active regions are interconnected in a common base configuration to provide the other one of the pair of transistors.

2. The amplifier recited in claim 1 including a plurality of first resistors disposed over the surface of the substrate, each one of the resistors having a first electrode adapted for coupling to ground potential and a second electrode connected to emitter regions of a corresponding pair of adjacent transistor cells formed in the first one of the active regions.

3. The amplifier recited in claim 2 wherein each one of the transistor cells in the first one of the active regions has a collector region connected to an emitter region of a corresponding one of the transistor cells in the second one of the active regions.

4. The amplifier recited in claim 3 including an output bus disposed over the surface of the substrate and wherein the collector regions of the transistor cells in the second one of the active regions are connected to the output bus, such bus providing an output for the amplifier.

5. The amplifier recited in claim 4 including a capacitor on the substrate, the capacitor having a first, upper plate coupled to base regions of the transistor cells in the second region and a second, lower plate adapted for coupling to ground.

6. An amplifier having a pair of transistors arranged in a cascode configuration, such amplifier, comprising:
   a substrate;
   a pair of elongated active regions formed along a pair of laterally spaced regions of a surface of the substrate, each one of the active regions having formed therein a plurality of electrically interconnected transistor cells;
   an output bus disposed over the surface of the substrate, the collector regions of the transistor cells in the second one of the active regions being connected to the output bus, such bus providing an output for the amplifier;
   a plurality of first resistors disposed over the surface of the substrate, each one of the resistors having a first electrode adapted for coupling to ground potential and a second electrode connected to emitter regions of a corresponding pair of adjacent transistor cells formed in the first one of the active regions; and
   a capacitor disposed on the substrate, the capacitor having a first, upper plate coupled to base regions of the transistor cells in the second region and a second, lower plate adapted fore coupling to ground;
      wherein the transistor cells in a first one of the active regions are interconnected in a common emitter configuration to provide one of the pair of transistors and the plurality of transistor cells in a second one of the active regions are interconnected in a common base configuration to provide the other one of the pair of transistors;
      wherein each one of the transistor cells in the first one of the active regions has a collector region connected to an emitter region of a corresponding one of the transistor cells in the second one of the active regions; and
      wherein the upper plate of the capacitor comprises an elongated conductive layer disposed over the surface portion of the substrate between the first and second active regions and wherein the conductive layer provides a bus.

7. The amplifier recited in claim 6 wherein first electrodes of the second resistors are connected successively along the bus.

8. The amplifier recited in claim 7 wherein the bus terminates in contact pads adapted for coupling a dc power supply to the base regions of the transistor cells in the second active region.

9. The amplifier recited in claim 7 wherein a second conductive layer is disposed under, and dielectrically separated from, the first-mentioned conductive layer to provide a second plate for the capacitor.

10. The amplifier recited in claim 9 wherein a second bus is disposed parallel to the conductive layers, first electrodes of the second resistor being connected successively along the second bus.

11. The amplifier recited in claim 10 wherein the base electrodes of the transistor cells in the second active region are also successively connected along the second bus thereby electrically interconnecting such base electrodes to the first electrodes of the second resistors.

12. The amplifier recited in claim 11 wherein second electrodes of the second resistors are connected successively along the first-mentioned conductive layer providing the upper plate of the capacitor, the base electrodes of the transistor cells in the second active region being connected to the upper plate of the capacitor through the plurality of second resistors.

13. The amplifier recited in claim 12 wherein the second plurality of resistors is disposed over a region of the surface of the substrate between the elongated conductive layers and the second active region.

14. The amplifier recited in claim 13 wherein a plurality of conductive via contacts is disposed in an elongated region of the substrate, the first active region being disposed between the elongated conductive via contact region and the conductive layers.

15. The amplifier recited in claim 14 wherein the conductive via contacts are electrically connected to the first electrodes of the first resistors.

16. The amplifier recited in claim 15 wherein a third elongated bus is disposed between the first active region and the elongated conductive via contact region to electrically connect base regions of the plurality of transistor cells in the first active region.

17. The amplifier recited in claim 16 wherein base regions of the transistor cells in the first active region are electrically connected successively along the third elongated bus.

18. The amplifier recited in claim 17 wherein a third plurality of resistors is disposed over the surface of the substrate.

19. The amplifier recited in claim 18 wherein the third plurality of resistors are disposed perpendicular to the buses, the first and second active regions and between adjacent pairs of the conductive via contacts.

20. The amplifier recited in claim 19 wherein the third resistors have first electrodes adapted for coupling to an input of the amplifier and second electrodes electrically connected successively along the third elongated bus.

21. The amplifier recited in claim 20 wherein a plurality of bridges is disposed over the surface of the substrate, such bridges passing over the third elongated bus to electrically connect the first plurality of resistors to the emitter regions of the transistor cells in the first active region.

22. The amplifier recited in claim 21 wherein a second plurality of bridges is disposed over the surface of the substrate, the second plurality of bridges passing over the conductive layers, the first-mentioned bus and the second conductive bus to interconnect emitter regions of the transistor cells in the second active region to the collector regions of the transistor cells in the first active region.

23. The amplifier recited in claim 22 wherein each one of the second bridges electrically connects a collector region of one of the transistor cells in the first active region to emitter regions of an adjacent pair of transistor cells in the second active region.

24. An amplifier having a pair of transistors arranged in a cascode configuration, such amplifier, comprising:
a substrate;
a pair of elongated active regions formed along a pair of laterally spaced regions of a surface of the substrate, each one of the active regions having formed therein a plurality of electrically interconnected transistor cells;
an output bus disposed over the surface of the substrate, the collector regions of the transistor cells in the second one of the active regions being connected to the output bus, such bus providing an output for the amplifier;
a plurality of first resistors disposed over the surface of the substrate, each one of the resistors having a first electrode adapted for coupling to ground potential and a second electrode connected to emitter regions of a corresponding pair of adjacent transistor cells formed in the first one of the active regions;
a plurality of second resistors disposed over the surface of the substrate, each one of the second resistors being electrically connected between base regions of the transistor cells in the second active region and the upper plate of the capacitor; and
a capacitor disposed on the substrate, the capacitor having a first, upper plate coupled to base regions of the transistor cells in the second region and a second, lower plate adapted fore coupling to ground;
wherein the transistor cells in a first one of the active regions are interconnected in a common emitter configuration to provide one of the pair of transistors and the Plurality of transistor cells in a second one of the active regions are interconnected in a common base configuration to provide the other one of the pair of transistors; and
wherein each one of the transistor cells in the first one of the active regions has a collector region connected to an emitter region of a corresponding one of the transistor cells in the second one of the active regions.

25. The amplifier recited in claim 24 wherein the upper plate comprises an elongated conductive layer disposed over the surface of the substrate between the first and second active regions.

26. The amplifier recited in claim 25 including a second conductive layer disposed under, and dielectrically separated from, the first-mentioned conductive layer to provide a second plate for the capacitor.

27. The amplifier recited in claim 26 wherein the second plurality of resistors is disposed over a region of the surface of the substrate between the elongated conductive layers and the second active region.

28. The amplifier recited in claim 27 including a plurality of conductive via contacts formed in an elongated region of the substrate, the first active region being disposed between the elongated conductive via region and the conductive layers.

29. The amplifier recited in claim 28 wherein the conductive via contacts are electrically connected to the first electrodes of the first resistors.

30. The amplifier recited in claim 29 wherein each one of the plurality of conductive via contacts is connected to a plurality of the first electrodes of the first resistors.

31. The amplifier recited in claim 30 including a second elongated bus disposed between the first active region and the elongated conductive via contact region to electrically interconnect base regions of the plurality of transistor cells in the first active region.

32. The amplifier recited in claim 31 including a third plurality of resistors disposed over the surface of the substrate.

33. The amplifier recited in claim 32 wherein the third plurality of resistors are disposed perpendicular to the first and second active regions and between adjacent pairs of the conductive via contacts.

34. The amplifier recited in claim 32 wherein each one of the third resistors has a first electrode adapted for coupling to an input to the amplifier and a second electrode electrically connected to the second bus.

35. The amplifier recited in claim 34 wherein the third plurality of resistors are connected successively along the second bus.

36. The amplifier recited in claim 35 including a plurality of bridges disposed over the surface of the substrate, each one of the bridges passing over the second bus and electrically connecting the first plurality of resistors to the emitter regions of the transistor cells in the first active region.

37. The amplifier recited in claim 36 including a second plurality of bridges disposed over the surface of the substrate, each one of the second plurality of bridges passing over the conductive layers and the first bus and electrically interconnecting an emitter region of one of the transistor cells in the second active region to a collector region of a corresponding of the transistor cells in the first active region.

\* \* \* \* \*